United States Patent

[11] 3,622,844

[72] Inventors Anthony E. Barelli; Wallace N. Shaunfield, Jr., both of Richardson, Tex.
[21] Appl. No. 850,875
[22] Filed Aug. 18, 1969
[45] Patented Nov. 23, 1971
[73] Assignee Texas Instruments Incorporated Dallas, Tex.

[54] AVALANCHE PHOTODIODE UTILIZING SCHOTTKY-BARRIER CONFIGURATIONS
6 Claims, 7 Drawing Figs.

[52] U.S. Cl. .......... 317/234, 317/235 UA, 317/234 UA, 317/235 T, 317/235 AG
[51] Int. Cl. .......... H01l 9/00, H01l 15/00, H01l 5/02
[50] Field of Search .......... 317/235 (31), 235 (46), 235 (9), 235 (30), 235 UA, 234 UA, 235 T, 235 AG

[56] References Cited

UNITED STATES PATENTS

| | | | |
|---|---|---|---|
| 3,463,971 | 8/1969 | Soshea et al. | 317/234 |
| 3,335,296 | 8/1967 | Smart | 307/88.5 |
| 3,529,161 | 9/1970 | Oosthoek | 250/83.3 |

OTHER REFERENCES

Schneider, B. S. T. J., Nov. 1966, pp. 1611–1615

*Primary Examiner*—John W. Huckert
*Assistant Examiner*—Martin H. Edlow
*Attorneys*—James O. Dixon, Andrew M. Hassell, Harold Levine, Melvin Sharp, John E. Vandigriff, Henry T. Olsen, Michael A. Sileo, Jr. and Gary C. Honeycutt

ABSTRACT: An avalanche Schottky-barrier photodiode includes a symmetrical metallic grid network deposited over a semiconductor substrate and surrounded by one or more metallic guard rings. When a sufficiently high voltage bias is supplied to the metallic grid network, carriers generated by light impinging upon the semiconductor substrate through the grid network are multiplied by the avalanche gain operation of the photodiode.

INVENTORS:
ANTHONY E. BARELLI
WALLACE N. SHAUNFIELD, JR.

INVENTOR:
ANTHONY E. BARELLI
WALLACE N. SHAUNFIELD, JR.

AVALANCHE PHOTODIODE UTILIZING SCHOTTKY-BARRIER CONFIGURATIONS

This invention relates to photodiodes, and more particularly to avalanche photodiodes utilizing Schottky-barrier structure.

Avalanche photodiodes having semiconductor PN junctions have been developed for some time and have been found useful for many applications such as laser range finding wherein low levels of light are available and where a fast response is necessary. More recent advances have been made in the development of Schottky-barrier avalanche photodiodes wherein a semitransparent metallic Schottky-barrier contact completely covers the active area of the photodiode. A deep diffused, relatively high resistivity guard ring layer disposed about the outer portion of the active area prevents premature breakdown caused by high fields at the edge of the diode.

An example of such photodiodes utilizing semitransparent metals is disclosed in *The Bell System Technical Journal*, 1968, Vol. 47, page 195, by M. P. Lepselter and S. N. Sze. A disclosure of avalanche photo gain obtained in GaAs Schottky-barrier photodiodes is disclosed in *Applied Physics Letters*, Mar. 15, 1969, Vol. 14, No. 6, page 197 et seq. by W. T. Lindley et al.

Some development work has also been done with Schottky-barrier photodiodes by defining holes through the transparent metal film covering the semiconductor substrate, but such devices have not generally been useful for operation in the avalanche mode and have often included additional coatings of antireflection material and the like.

Although previously developed avalanche photodiodes have been useful in a number of applications, problems have arisen in utilizing such prior photodiodes for the detection of relatively short wavelength light as for instance, light within the shorter wavelength region of the visible spectrum. With prior semiconductor PN junction avalanche photodiodes, the light being sensed must be absorbed generally below the diffused area for optimum results. Relatively short wavelength light often cannot penetrate such diffused areas and is thus not optimally sensed by such photodiodes, even when extremely thin diffused areas are utilized. Another problem exists with prior Schottky-barrier photodiodes utilizing semitransparent metallic layers, as the impinging light must penetrate the metal layers, thereby experiencing attenuation before being absorbed within the semiconductor layer. Additionally, the requirement of prior photodiode of a diffused guard ring area is expensive and requires time consuming and exact fabrication techniques.

In accordance with the present invention, an easily fabricated Schottky-barrier avalanche photodiode is provided which is particularly useful for sensing light of relatively short wavelength. Spaced apart metallic contacts are disposed in contact with a semiconductor substrate and receive a voltage bias sufficient to create high electrical field regions within the substrate at the edge portions of the contacts. Light impinging directly upon the semiconductor substrate then generates carriers which are multiplied by the avalanche gain operation of the photodiode. A conductive guard ring is disposed upon the semiconductor substrate and surrounds the contacts to prevent premature breakdown caused by high electric fields at the edge portion of the photodiode.

In accordance with another aspect of the invention, an avalanche Schottky-barrier photodiode includes a plurality of symmetrically spaced apart metallic diodes disposed in contact with a semiconductor substrate. The contacts are electrically biased such that depletion regions are induced within the substrates, the individual depletion regions meet with one another to form one continuous region of high electric field. This condition maximizes the frequency response of the photodiode. Light impinging directly upon the semiconductor substrate past the spaced apart metallic contacts thus generates carriers which experience avalanche gain operation of the photodiode.

In accordance with another aspect of the invention, spaced apart metallic contacts are disposed upon a semiconductor substrate and receive a voltage bias sufficient to create a plurality of relatively high electrical fields within the substrate at the edge portions of the contacts. A pair of generally concentric conductive rings are disposed upon the semiconductor substrate and surround the metallic contacts to prevent premature breakdown of the device.

For a more complete understanding of the present invention, and for further objects and advantages thereof, reference is now made to the following description taken in conjunction with the accompanying drawings, in which.

Figure 1:
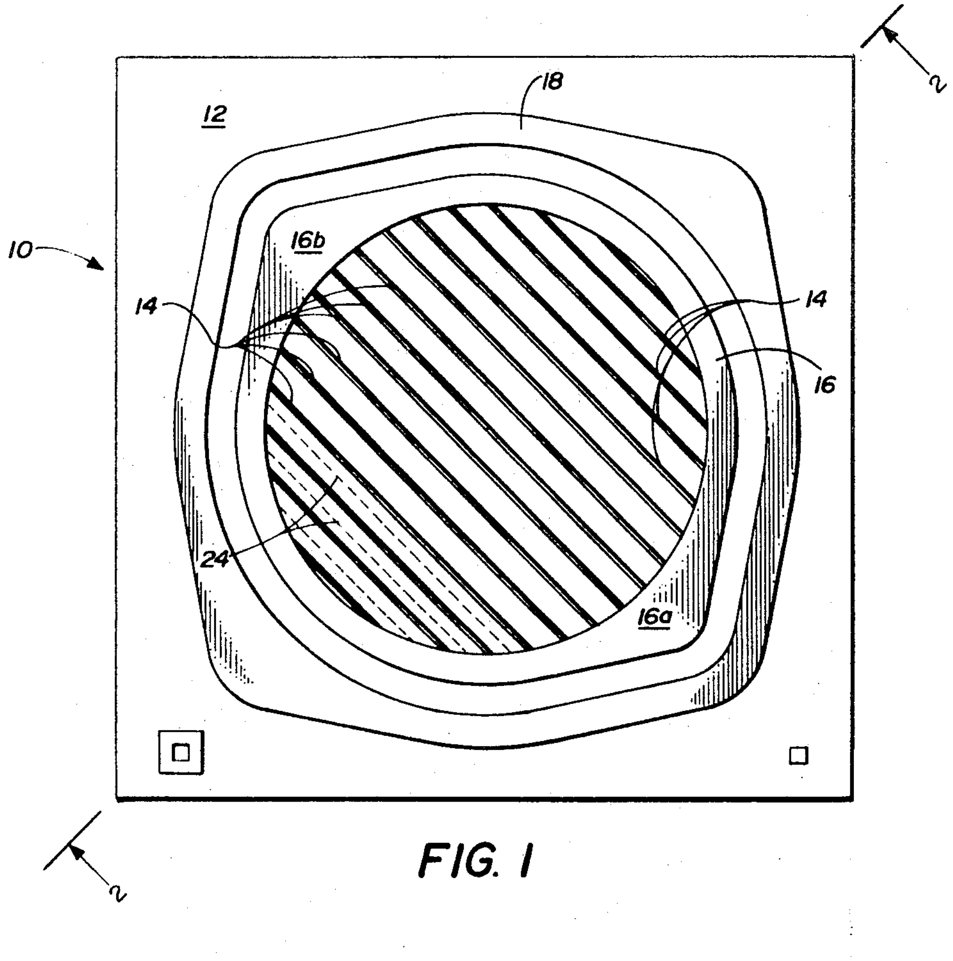
FIG. 1 is a top view of a Schottky-barrier avalanche photodiode according to the invention.
Figure 2:
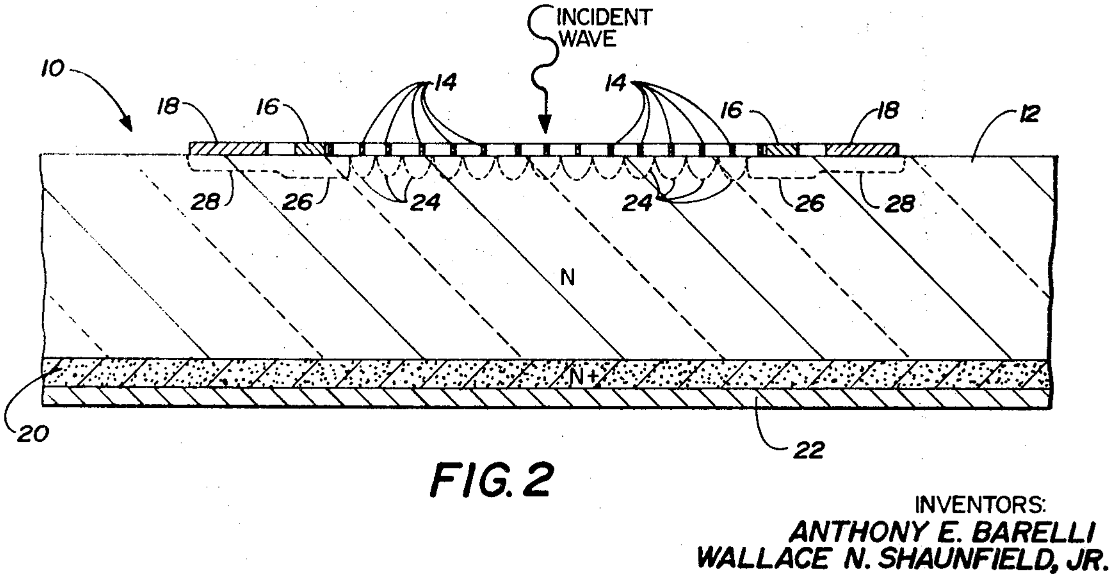
FIG. 2 is a cross-sectional view of the photodiode shown in FIG. 1 taken generally along the section line 2—2.

Referring to FIGS. 1 and 2, the preferred embodiment of the present photodiode is illustrated generally by the numeral 10. The device comprises a semiconductor substrate 12 upon which are deposited a plurality of spaced apart grid contacts 14. In the preferred embodiment, the grid contacts 14 are parallel, evenly spaced apart and are electrically connected at either end by a generally circular conductive ring 16. A pair of bonding pads **16*a* and 16*b* are formed in the ring 16 to facilitate bonding of terminals for the application of voltage bias to the device. An outer conductive ring 18 is generally symmetrically disposed about ring 16** for the prevention of premature voltage breakdown, and to reduce surface leakage currents.

Referring specifically to FIG. 2, a semiconductor substrate of type N supports the grid contacts 14, with a diffused N+ layer 20 being disposed on the back side of the device for contact with a metallization layer 22. Although any suitable type of semiconductor material may be utilized for the invention, the preferred N-type semiconductor is found to provide excellent results with Schottky-barrier contacts. The N+-type diffused region 20 may be eliminated for many applications, but in the preferred embodiment is utilized with an alloyed gold layer 22 to provide a suitable terminal for the device.

The metal utilized for the grid contacts 14 and for the rings 16 and 18, will be chosen from metals which produce optimal Schottky-barrier effects on the type of semiconductor substrate being utilized. With the use of N-type semiconductor substrate, metals such as platinum, gold or molybdenum provide good results for such semiconductor materials as gallium arsenide, germanium or silicon. When P-type semiconductor substrates are utilized for the invention, other metals will be utilized which provide optimal Schottky-barrier effects for the particular semiconductor material utilized. If desired, the grid contacts 14 may comprise a generally semitransparent metal such as gold or the like.

An important aspect of the invention is that the grid line contact 14 are properly spaced apart and dimensioned for a particular voltage bias applied, and for the density of the impurities in the semiconductor substrate, such that the depletion regions introduced within the semiconductor substrate 12 meet with one another. This insures that the complete upper area of the present photodiode device is depleted. This effect is particularly illustrated in FIG. 2, where it may be seen that the depletion regions diagrammatically designated by numerals 24 are of sufficient magnitude that the edges of each depletion region are common with the adjacent depletion region. This depletion region intermingling effect is also illustrated in FIG. 1, wherein the edge portions of the depletion regions 24 are illustrated as being common. Only a portion of the depletion regions are shown in FIG. 1 for ease of illustration.

It has been found that when depletion areas 24 meet or intermingle, a maximum frequency response is provided for the photodiode. It is thus important to provide a large surface area of the depletion regions in the active region of the device. This criteria must be balanced against a practical ratio of exposed active zone to metal area, which should be relatively large if the metal utilized is not light transparent. It is also desirable to minimize the resistance of the grid contacts 14 in order to maximize the frequency response of the photodiode. This minimization of resistance must be, however, considered with respect to the desirable narrow width of the metal grid contacts to provide maximum quantum efficiency.

It will be noted that the depletion regions 26 and 28 meet in the illustrated embodiment. Premature breakdown of the device is thus reduced. In some instances, it may be desirable to bias rings 16 and 18 such that the depletion regions 26 and 28 do not meet. In this case, the semiconductor region under ring 16 becomes photoactive, and the depletion region 28 prevents excess surface leakage. Additionally, other concentric rings may be formed outside of ring 18 to further reduce surface leakage.

The grid line contacts 14 and rings 16 and 18 may be conventionally formed by evaporation disposition of metal and etching processing by conventional masking and photoresist methods. Although the dimensions of a particular photodiode constructed in accordance with the invention will vary according to required operating conditions, a photodiode that has worked well in practice comprised a circular active region of N-type silicon material approximately 30 mils in diameter, and having a resistivity 100–300Ω cm. overlaid with 15 parallel grid line contacts approximately 0.2 mils wide and equally separated by 2 mils. An alloyed gold contact 22 and an N+ diffused layer 20 was provided on the back side of the device. A conductive ring 16 was provided with a width of slightly over 1 mil, with large bonding pads **16*a* and 16*b* having widths of slightly less than 3 mils. The outer ring 18 was provided with similar widths as the ring 16. In operation, the ring 16 was subjected to a voltage bias of approximately 70 volts. The outer ring 18** was subjected to a slightly lower voltage bias in some instances. In some embodiments, a diffused P-type guard ring region has been used.

Referring to FIG. 1, it will be noticed that the grid contacts 14 are generally aligned with respect to the bonding areas **16*a* and 16*b*. As the voltage bias is applied at one of these bonding areas, this orientation of the grid contacts 14** provides the path of least resistance for current flow, thereby providing optimum operation of the photodiode.

The operation of the photodiode shown in FIGS. 1 and 2 upon light impingement will be apparent and thus will not be discussed in detail. As is well-known, the Schottky-barrier photodiode is a rectifying metal-to-semiconductor contact in which incident illumination creates electron-hole pairs within the semiconductor by the internal photoelectric effect. These elecron-hole pairs are separated due to the externally applied electrical field across the semiconductor and the metal contacts, and the carriers are swept into the depletion regions surrounding the edge regions of the metal contacts 14. The current created by the separation of the electron-hole pairs is increased by avalanche multiplication in the well-known manner.

The present invention device is thus particularly useful for avalanche mode operation with relatively short wavelength light, due to the fact that the light does not have to penetrate a metal layer of diffused layer in order to be absorbed. Hence, the present invention provides an extremely useful two-terminal device for use with relatively low levels of light in the blue region, as well as with light having longer wavelengths.

Figure 3:
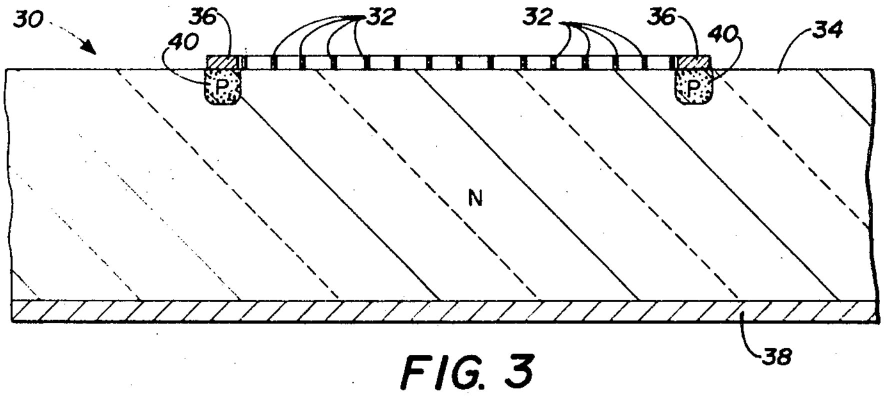
FIG. 3 is a sectional view of another embodiment of the photodiode according to the invention.

FIG. 3 illustrates another embodiment of the present device designated generally by the numeral 30. An array of parallel metal grid lines 32 are formed over an N-type semiconductor substrate 34 in a similar manner as shown in FIGS. 1 and 2. Each of the grid lines 32 are joined by a surrounding metal guard ring 36. A metal contact 38 is formed on the back side of the device to receive a suitable bias voltage. Since the present diode is a low current device, the ohmic contact characteristics of metal contact 38 is in some instances noncritical. Instead of the outer conductive ring 18 shown in FIGS. 1 and 2, the present embodiment utilizes a conventional diffused region 40 beneath the ring 36 in order to prevent premature breakdown of the device. The device 30 operates in the same manner as previously described, with the ring 36 and diffused area 40 operating to prevent premature breakdown. If desired, an outer additional metallic ring may be disposed concentrically with the ring 36 to provide additional leakage protection.

Figure 4:
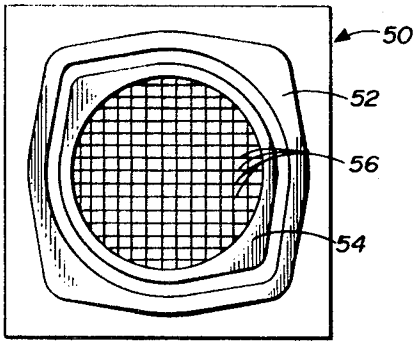
FIG. 4 is a top view of another embodiment of an avalanche photodiode according to the invention wherein a rectangular grid contact network is utilized in the active region of the photodiode.

FIGS. 4–7 illustrate other embodiments of the invention which utilize different forms of symmetrical grid contacts over the active region of the photodiode. FIG. 4 illustrates an avalanche photodiode designated generally by the numeral 50 which comprises an outer guard ring contact 52 surrounding a contact ring 54. A plurality of thin metal grid lines 56 form a rectangular grid over the active region of the device, with each of the lines 56 contacting ring 54. The grid configuration shown in FIG. 4 provides a large number of symmetrical Schottky-barrier edge contacts to provide a plurality of areas of high electric field intensity.

Figure 5:
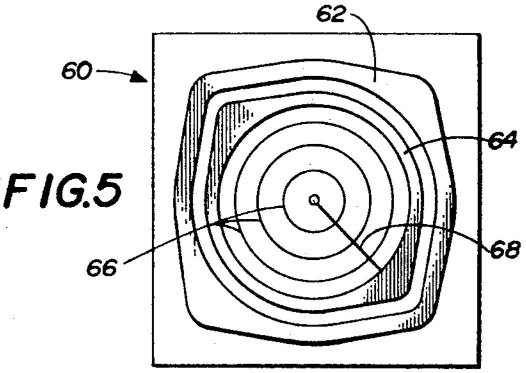
FIG. 5 is a top view of another embodiment of an avalanche photodiode according to the invention wherein a plurality of concentric ring contacts are utilized over the active area of the photodiode.

FIG. 5 illustrates an avalanche photodiode 60 according to the invention which includes an outer metal ring 62 which surrounds ring 64. A plurality of concentric rings 66 are formed by thin metal lines over the active area of the device, with each of the rings 66 being connected by a lead 68 to ring 64.

Figure 6:
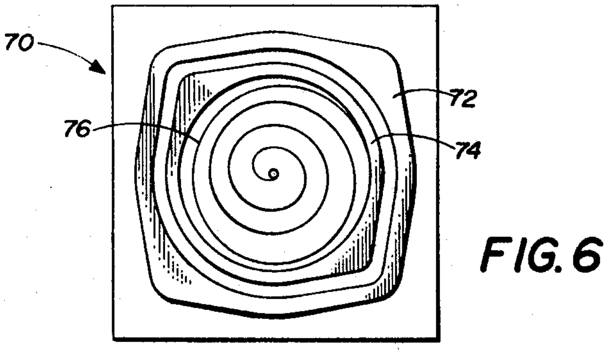
FIG. 6 is a top view of another embodiment of the present invention wherein a spiral metallic contact is utilized in the active region of the photodiode.

A somewhat similar avalanche photodiode according to the invention is illustrated in FIG. 6, and designated generally by the numeral 70. Again, an outer conductive ring 72 surrounds a conductive metal ring 74 deposited over a semiconductor substrate in the manner previously described. A continuous spiral is formed by metal lead 76 which runs from contact with ring 74 to the center of the active area. If desired bias may be applied both to the ring 74 and to the center of the spiral formed by leads 76 to insure even voltage distribution of the active area of the device.

Figure 7:
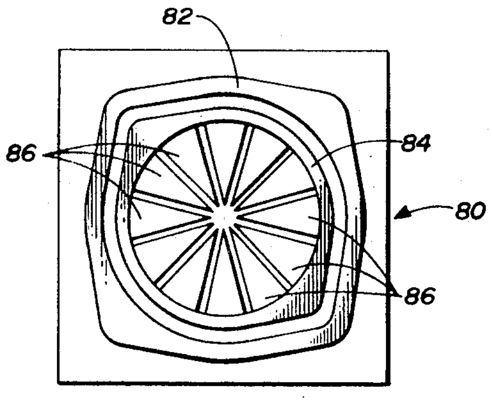
FIG. 7 is a top view of yet another embodiment of the invention wherein a plurality of sharp pointed contacts are disposed over the active region of the photodiode.

Yet another embodiment of the invention is illustrated in FIG. 7 and designated by numeral 80. An outer metal guard ring 82 surrounds guard ring 84. A plurality of generally triangular contact members 86 contact ring 84 and extend generally toward the middle portion of the active area of the device. It may in some instances be desirable to make members 86 of transparent metal, or to provide apertures therein to allow for greater light admission in the active area of the device 80. The sharp points of the members 86 generate extremely high symmetrical electrical fields in the active area of the device, to provide for high avalanche gain operation.

It will thus be seen that the present invention provides an avalanche photodiode extremely useful in detection of the short wavelengths of light such as light in the blue region. Additionally, in certain embodiments of the invention, no diffused guard ring construction is required, thereby eliminating processing steps and expense. The present grid Schottky-barrier concept reduces the amount of light lost to absorption and reflection from the metal on the surface of the photodiode, as well as increasing the performance and operational capabilities of the device for certain applications.

Although the present invention has been described with respect to several specific embodiments of symmetrical Schottky-barrier grids over the active region of avalanche photodiodes, in addition to various combination of guard rings and guard diffusion areas, it will be apparent that other modifications and changes will be suggested to one skilled in the art, and it is intended to encompass such changes and modifications as fall within the scope of the appended claims.

We claim:

1. An avalanche Schottky-barrier photodiode comprising a relatively low resistivity semiconductor substrate of one conductivity type having at least one major surface and a metal contact means on said surface forming a Schottky-barrier rectifying junction with said substrate, said contact means having a plurality of selective openings therein exposing areas of said substrate to allow impingement of light directly upon the exposed substrate areas, said contact means being adaptive to receive a reverse voltage bias to means for selective electric field regions in said substrate such that carriers creating generated by said light impinging upon said substrate areas are multiplied by avalanche gain.

2. The photodiode of claim 1 wherein the resistivity of said substrate is on the order of 100–300 ohm–cm.

3. The photodiode of claim 1 further comprising a continuous metallic conductor area circumscribing said contact means and forming a Schottky-barrier junction with said substrate.

4. The photodiode of claim 1 including a semiconductor guard area of opposite conductivity type diffused in said semiconductor substrate and surrounding as contact means.

5. The photodiode of claim 1 wherein said contact means is comprised of a plurality of discrete, interconnected selectivity spaced apart metallic areas symmetrically arranged on said substrate surface.

6. The photodiode of claim 5 wherein said metallic areas are a plurality of parallel strips interconnected by a circumscribing metallic area.

* * * * *